United States Patent
Barua et al.

(10) Patent No.: US 10,832,753 B2
(45) Date of Patent: Nov. 10, 2020

(54) COMPONENTS INCLUDING STRUCTURES HAVING DECOUPLED LOAD PATHS

(71) Applicant: General Electric Company, Schenectady, NY (US)

(72) Inventors: Ananda Barua, Schenectady, NY (US); Arun Karthi Subramaniyan, Clifton Park, NY (US); Changjie Sun, Clifton Park, NY (US); Daniel Jason Erno, Clifton Park, NY (US); Darren Lee Hallman, Scotia, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 15/663,288

(22) Filed: Jul. 31, 2017

(65) Prior Publication Data
US 2019/0311758 A1   Oct. 10, 2019

(51) Int. Cl.
*G11C 11/22* (2006.01)
*G11C 11/41* (2006.01)
*H01L 27/02* (2006.01)
*H01M 8/04* (2016.01)
*H05K 1/02* (2006.01)
(Continued)

(52) U.S. Cl.
CPC ........ *G11C 11/2259* (2013.01); *B22F 3/1055* (2013.01); *B29C 64/00* (2017.08); *B29C 64/153* (2017.08); *B29C 64/20* (2017.08); *B33Y 10/00* (2014.12); *B33Y 30/00* (2014.12); *B33Y 80/00* (2014.12); *G11C 11/41* (2013.01); *H01L 27/0207* (2013.01); *H01M 8/04* (2013.01); *H05K 1/025* (2013.01); *B22F 5/10* (2013.01)

(58) Field of Classification Search
CPC .................................. G11C 8/12; G11C 8/16
USPC ........................................ 365/230.06, 230.03
See application file for complete search history.

(56) References Cited

U.S. PATENT DOCUMENTS 3,611,317 A * 10/1971 Bonfeld ................ G11C 11/412
257/691
5,089,862 A * 2/1992 Warner, Jr. ............. H01L 21/76
326/44
(Continued)

FOREIGN PATENT DOCUMENTS

CN       104190930 B     3/2016
CN       106553750 A     4/2017
(Continued)

OTHER PUBLICATIONS

Tao et al., "Design of lattice structure for additive manufacturing", Flexible Automation (ISFA), International Symposium on, pp. 325-332, 2016, Cleveland, OH.
(Continued)

*Primary Examiner* — Michael T Tran
(74) *Attorney, Agent, or Firm* — Dority & Manning, P.A.

(57) ABSTRACT

A unit cell structure is provided. The unit cell structure includes a first section and a second section. The first section defines a first load path and includes a first plurality of first unit cells joined together. The second section defines a second load path separate from the first load path and includes a second plurality of second unit cells joined together, each second unit cell of the second plurality of second unit cells nested within and spaced apart from each first unit cell of the first plurality of first unit cells of the first section.

14 Claims, 6 Drawing Sheets

(51) Int. Cl.
  *B29C 64/20* (2017.01)
  *B29C 64/153* (2017.01)
  *B33Y 80/00* (2015.01)
  *B33Y 10/00* (2015.01)
  *B33Y 30/00* (2015.01)
  *B22F 3/105* (2006.01)
  *B29C 64/00* (2017.01)
  *B22F 5/10* (2006.01)

(56) References Cited

U.S. PATENT DOCUMENTS

| | | | | |
|---|---|---|---|---|
| 5,146,299 A * | 9/1992 | Lampe | H01L 27/11502 | 257/295 |
| 5,801,959 A * | 9/1998 | Ding | G06F 17/5077 | 716/119 |
| 6,407,945 B2 * | 6/2002 | von Schwerin | G11C 16/0416 | 365/185.18 |
| 6,735,106 B2 * | 5/2004 | Rickes | G11C 11/22 | 365/145 |
| 7,028,240 B1 * | 4/2006 | Bautista, Jr. | G11C 29/02 | 365/185.29 |
| 7,673,270 B1 * | 3/2010 | Wang | G03F 1/36 | 716/112 |
| 7,929,336 B2 * | 4/2011 | Philipp | G11C 13/0004 | 365/148 |
| 8,508,984 B2 * | 8/2013 | Ranjan | H01L 43/08 | 365/158 |
| 8,661,422 B2 * | 2/2014 | Lethin | G06F 12/023 | 717/151 |
| 8,710,566 B2 * | 4/2014 | Ellis | H01L 27/108 | 257/300 |
| 8,866,118 B2 * | 10/2014 | Nardi | H01L 45/146 | 257/2 |
| 9,225,164 B2 | 12/2015 | Barber et al. | | |
| 9,257,166 B2 * | 2/2016 | Kim | G11C 11/1673 | |
| 9,432,298 B1 * | 8/2016 | Smith | H04L 49/9057 | |
| 9,812,461 B2 * | 11/2017 | Doda | H01L 27/1157 | |
| 10,026,780 B2 * | 7/2018 | Kamata | H01L 45/06 | |
| 2004/0186551 A1 | 9/2004 | Kao et al. | | |
| 2008/0153226 A1 * | 6/2008 | Mokhlesi | H01L 27/115 | 438/259 |
| 2009/0225606 A1 * | 9/2009 | Eggleston | G06F 11/1068 | 365/185.33 |
| 2010/0110778 A1 * | 5/2010 | Lee | G11C 13/0004 | 365/163 |
| 2010/0117053 A1 * | 5/2010 | Sekar | G11C 13/0007 | 257/4 |
| 2010/0202229 A1 * | 8/2010 | Osborne | G11C 7/1012 | 365/203 |
| 2011/0310656 A1 * | 12/2011 | Kreupl | G11C 11/16 | 365/148 |
| 2011/0316063 A1 * | 12/2011 | Tang | H01L 27/0688 | 257/314 |
| 2012/0153249 A1 * | 6/2012 | Zhang | H01L 45/08 | 257/4 |
| 2013/0031326 A1 * | 1/2013 | Grunzke | G11C 5/04 | 711/167 |
| 2013/0206374 A1 | 8/2013 | Roisin et al. | | |
| 2013/0221310 A1 * | 8/2013 | Morikawa | H01L 45/144 | 257/2 |
| 2013/0242668 A1 * | 9/2013 | Kim | G11C 16/10 | 365/185.19 |
| 2014/0034892 A1 * | 2/2014 | Erbetta | H01L 45/06 | 257/2 |
| 2014/0078814 A1 * | 3/2014 | Shimakawa | G11C 13/0007 | 365/148 |
| 2014/0143470 A1 * | 5/2014 | Dobbs | G06F 9/44505 | 710/308 |
| 2014/0239245 A1 * | 8/2014 | Lengade | H01L 45/12 | 257/4 |
| 2014/0247674 A1 * | 9/2014 | Karda | G11C 11/40 | 365/189.011 |
| 2014/0269075 A1 * | 9/2014 | Van Duuren | G11C 16/10 | 365/185.17 |
| 2014/0313839 A1 * | 10/2014 | Sakui | G11C 16/0483 | 365/191 |
| 2014/0361238 A1 * | 12/2014 | Joshi | H01L 45/06 | 257/5 |
| 2015/0091188 A1 * | 4/2015 | Lee | H01L 21/823828 | 257/774 |
| 2015/0190971 A1 | 7/2015 | Musuvathy et al. | | |
| 2015/0303372 A1 * | 10/2015 | Meade | H01L 43/08 | 257/421 |
| 2016/0327113 A1 | 11/2016 | Shelley | | |
| 2016/0363389 A1 | 12/2016 | Hemker et al. | | |
| 2017/0011155 A1 | 1/2017 | Ruto et al. | | |
| 2017/0075757 A1 * | 3/2017 | Im | G06F 11/1068 | |
| 2017/0076762 A1 * | 3/2017 | Lee | G11C 7/1048 | |
| 2017/0117032 A1 * | 4/2017 | Takizawa | G11C 11/4091 | |
| 2017/0315741 A1 * | 11/2017 | Hashimoto | G06F 3/0619 | |
| 2017/0315914 A1 * | 11/2017 | Muralimanohar | G06F 12/0804 | |
| 2018/0033479 A1 * | 2/2018 | Lea | G11C 8/12 | |
| 2018/0033495 A1 * | 2/2018 | Ghosh | G11C 29/781 | |
| 2018/0053553 A1 * | 2/2018 | Tran | G11C 16/08 | |
| 2018/0061503 A1 * | 3/2018 | Lee | G11C 16/10 | |
| 2018/0082741 A1 * | 3/2018 | Yi | G11C 13/0023 | |
| 2018/0095678 A1 * | 4/2018 | McClain | G06F 3/064 | |
| 2018/0181304 A1 * | 6/2018 | Mitra | G06F 3/061 | |
| 2018/0182463 A1 * | 6/2018 | Dutta | G11C 16/3427 | |
| 2018/0190353 A1 * | 7/2018 | Srinivasan | G11C 13/0033 | |
| 2019/0036018 A1 * | 1/2019 | Manipatruni | G11B 5/73 | |
| 2019/0050717 A1 * | 2/2019 | Temam | G06F 9/3895 | |
| 2019/0303156 A1 * | 10/2019 | Panda | G06N 3/063 | |
| 2019/0372134 A1 * | 12/2019 | Katikaneni | H01M 8/0247 | |
| 2020/0018713 A1 * | 1/2020 | Bunes | G01N 27/127 | |
| 2020/0118629 A1 * | 4/2020 | Kim | G11C 16/08 | |
| 2020/0133574 A1 * | 4/2020 | Lee | G06F 3/0659 | |
| 2020/0135256 A1 * | 4/2020 | Ibrahim Mohamed | G11C 7/1018 | |
| 2020/0257643 A1 * | 8/2020 | Grohoski | G06F 12/10 | |

FOREIGN PATENT DOCUMENTS

| | | |
|---|---|---|
| EP | 3147202 A1 | 3/2017 |
| WO | 2016092191 A1 | 6/2016 |
| WO | 2016175813 A1 | 11/2016 |
| WO | WO2016/179242 A1 | 11/2016 |

OTHER PUBLICATIONS

Nguyen et al., "A method to generate lattice structure for Additive Manufacturing", Industrial Engineering and Engineering Management (IEEM), 2016 IEEE International Conference on, pp. 966-970, 2016, Bali.

European Search Report Corresponding to Application No. 18182936 dated Dec. 11, 2018.

Machine Translated Japanese Office Action Corresponding to Application No. 2018140844 dated Dec. 18, 2019.

Chinese Search Report and Office Action Corresponding to Application No. 201810841305 dated Jun. 19, 2020.

* cited by examiner

COMPONENTS INCLUDING STRUCTURES HAVING DECOUPLED LOAD PATHS

BACKGROUND

The field of the disclosure relates generally to components, and, more particularly, to components including nested unit cells sized and arranged to create structures within the components with independent and decoupled load paths.

Known components and structures are configured to carry loads during use in their application. The loads may include, without limitation, mechanical loading, thermal loading, electrical loading, or a combination of the types of loading. At least some known components use structures that have the same load paths for different loads. The structures must be designed to handle the multiple loads and are often built larger than necessary to handle the multiple types of loads while maintaining a sufficient safety factor, which can result in the component being excessively heavy for the application and more expensive. Accordingly, it is desirable to decouple the load paths within a structure to facilitate creating lightweight multifunctional structures with optimized load-bearing characteristics for each load the structure experiences in its intended application.

BRIEF DESCRIPTION

In one aspect, a unit cell structure is provided. The unit cell structure includes a first section and a second section. The first section defines a first load path and includes a first plurality of first unit cells joined together. The second section defines a second load path separate from the first load path and includes a second plurality of second unit cells joined together, each unit cell of the second plurality of second unit cells nested within and spaced apart from each first unit cell of the first plurality of first unit cells of the first section.

In another aspect, a component is provided. The component includes a first structure and a second structure. The second structure includes a first section and a second section. The first section defines a first load path and includes a first plurality of first unit cells joined together, wherein the first section is coupled to the first structure and a first load. The second section defines a second load path separate from the first load path and includes a second plurality of second unit cells joined together, each second unit cell of the second plurality of second unit cells nested within and spaced apart from each first unit cell of the first plurality of first unit cells of the first section, wherein the second section is coupled to the first structure and a second load.

In yet another aspect, a method of fabricating a component with an additive manufacturing system including a consolidating device is provided. The method includes providing a build file of the component on a controller of the additive manufacturing system. The method also includes depositing a material onto a surface. The method further includes operating the consolidating device to consolidate the material to form a first structure and a second structure. The second structure includes a first section and a second section. The first section defines a first load path and includes a first plurality of first unit cells joined together, wherein the first section is coupled to the first structure. The second section defines a second load path separate from the first load path and includes a second plurality of second unit cells joined together, each second unit cell of the second plurality of second unit cells nested within and spaced apart from each first unit cell of the first plurality of first unit cells of the first section, wherein the second section is coupled to the first structure.

DRAWINGS

These and other features, aspects, and advantages of the present disclosure will become better understood when the following detailed description is read with reference to the accompanying drawings in which like characters represent like parts throughout the drawings, wherein.

Figure 1:
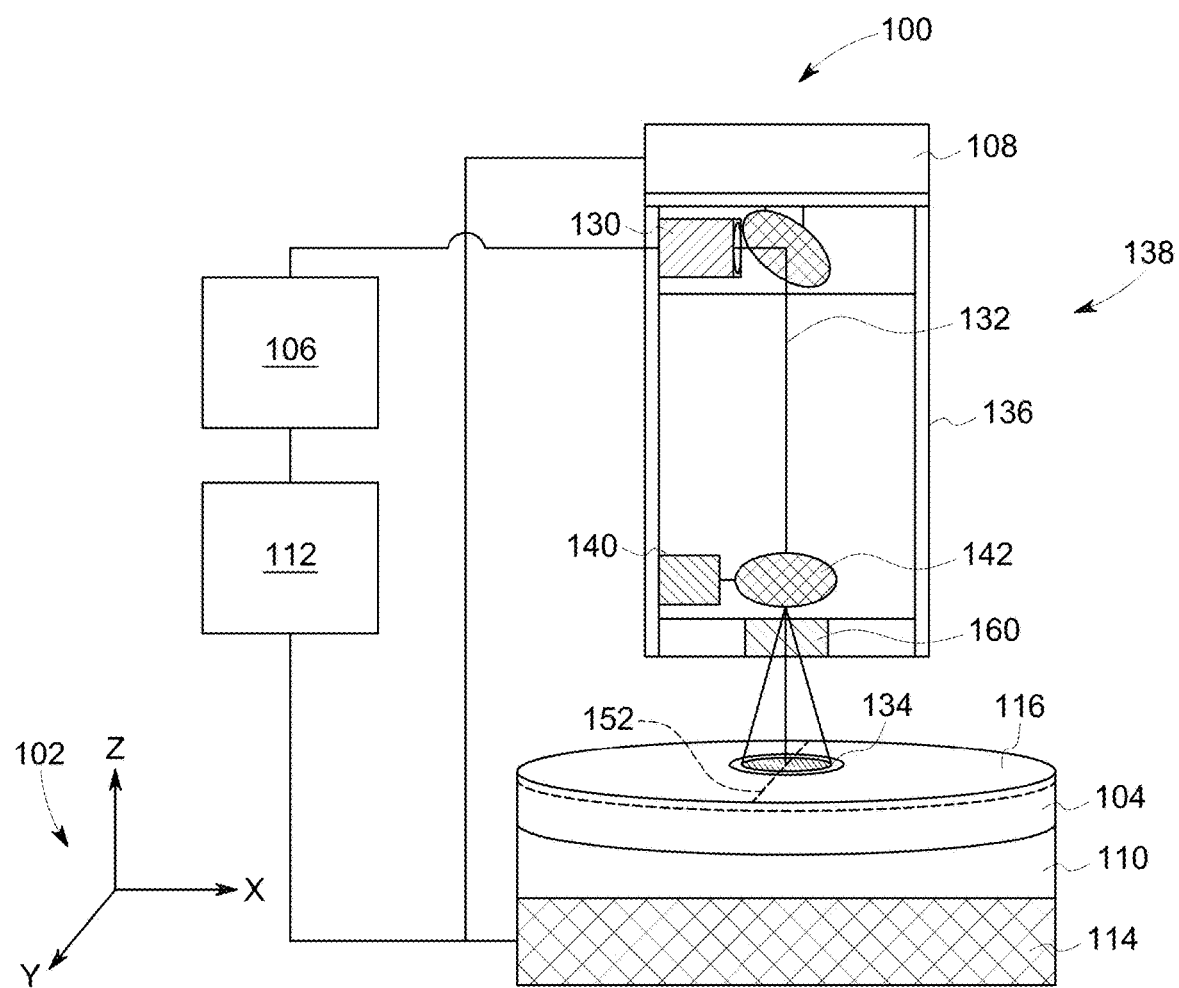
FIG. 1 is a schematic view of an additive manufacturing system.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

As used herein, the terms "processor" and "computer," and related terms, e.g., "processing device," "computing device," and "controller" are not limited to just those integrated circuits referred to in the art as a computer, but broadly refers to a microcontroller, a microcomputer, a programmable logic controller (PLC), and application specific integrated circuit, and other programmable circuits, and these terms are used interchangeably herein. In the embodiments described herein, memory may include, but it not limited to, a computer-readable medium, such as a random access memory (RAM), a computer-readable non-volatile medium, such as a flash memory. Alternatively, a floppy disk, a compact disc-read only memory (CD-ROM), a magneto-optical disk (MOD), and/or a digital versatile disc (DVD) may also be used. Also, in the embodiments described herein, additional input channels may be, but are not limited to, computer peripherals associated with an operator interface such as a mouse and a keyboard. Alternatively, other computer peripherals may also be used that may include, for example, but not be limited to, a scanner. Furthermore, in the exemplary embodiment, additional output channels may include, but not be limited to, an operator interface monitor.

Further, as used herein, the terms "software" and "firmware" are interchangeable, and include any computer program storage in memory for execution by personal computers, workstations, clients, and servers.

As used herein, the term "non-transitory computer-readable media" is intended to be representative of any tangible computer-based device implemented in any method of technology for short-term and long-term storage of information, such as, computer-readable instructions, data structures, program modules and sub-modules, or other data in any device. Therefore, the methods described herein may be encoded as executable instructions embodied in a tangible, non-transitory, computer-readable medium, including, without limitation, a storage device and/or a memory device. Such instructions, when executed by a processor, cause the processor to perform at least a portion of the methods described herein. Moreover, as used herein, the term "non-transitory computer-readable media" includes all tangible, computer-readable media, including, without limitation, non-transitory computer storage devices, including without limitation, volatile and non-volatile media, and removable and non-removable media such as firmware, physical and virtual storage, CD-ROMS, DVDs, and any other digital source such as a network or the Internet, as well as yet to be developed digital means, with the sole exception being transitory, propagating signal.

Furthermore, as used herein, the term "real-time" refers to at least one of the time of occurrence of the associated events, the time of measurement and collection of predetermined data, the time to process the data, and the time of a system response to the events and the environment. In the embodiments described herein, these activities and events occur substantially instantaneously.

The embodiments described herein facilitate manufacturing a component using an additive manufacturing process where the component includes a multifunctional nested unit cell structure having decoupled loading bearing properties. The nested unit cell structure includes a first section of unit cells joined together and defining a first load path, and a second section of unit cells joined together, nested within the first section of unit cells, and defining a second load path. Generally, a monolithic (i.e. single piece) structure that is subject to multiple loads will experience deformation and/or material property changes in a manner consistent with the cumulative loading. This loading may include, without limitation, mechanical, thermal, and electrical loading. However, when unit cells are arranged as part of a nested multiple decoupled section structure, the decoupled load bearing sections are able to independently carry the load without affecting an adjacent decoupled load bearing section. Additionally, the volume within and between the unit cell sections may be utilized as cooling or heating circuits, each circuit isolated from an adjacent circuit.

Additive manufacturing processes and systems include, for example, and without limitation, vat photopolymerization, powder bed fusion, binder jetting, material jetting, sheet lamination, material extrusion, directed energy deposition and hybrid systems. These processes and systems include, for example, and without limitation, SLA—Stereolithography Apparatus, DLP—Digital Light Processing, 3SP—Scan, Spin, and Selectively Photocure, CLIP—Continuous Liquid Interface Production, SLS—Selective Laser Sintering, DMLS—Direct Metal Laser Sintering, SLM—Selective Laser Melting, EBM—Electron Beam Melting, SHS—Selective Heat Sintering, MJF—Multi-Jet Fusion, 3D Printing, Voxeljet, Polyjet, SCP—Smooth Curvatures Printing, MJM—Multi-Jet Modeling Projet, LOM—Laminated Object Manufacture, SDL—Selective Deposition Lamination, UAM—Ultrasonic Additive Manufacturing, FFF—Fused Filament Fabrication, FDM—Fused Deposition Modeling, LIVID—Laser Metal Deposition, LENS—Laser Engineered Net Shaping, DMD—Direct Metal Deposition, Hybrid Systems, and combinations of these processes and systems. These processes and systems may employ, for example, and without limitation, all forms of electromagnetic radiation, heating, sintering, melting, curing, binding, consolidating, pressing, embedding, and combinations thereof.

Additive manufacturing processes and systems employ materials including, for example, and without limitation, polymers, plastics, metals, ceramics, sand, glass, waxes, fibers, biological matter, composites, and hybrids of these materials. These materials may be used in these processes and systems in a variety of forms as appropriate for a given material and the process or system, including, for example, and without limitation, as liquids, solids, powders, sheets, foils, tapes, filaments, pellets, liquids, slurries, wires, atomized, pastes, and combinations of these forms.

FIG. 1 is a schematic view of an exemplary additive manufacturing system 100. A coordinate system 102 includes an x-axis, a y-axis, and a z-axis. In the exemplary embodiment, additive manufacturing system 100 includes a consolidating device 138 including a laser device 130, a scanning motor 140, a scanning mirror 142, and a scanning lens 160 for fabricating a component 104 using a layer-by-layer manufacturing process. Alternatively, consolidating device 138 may include any component that facilitates consolidation of a material using any of the processes and systems described herein. Laser device 130 provides a high-intensity heat source configured to generate a melt pool 134 (not shown to scale) in a powdered material using an energy beam 132. Laser device 130 is contained within a housing 136 that is coupled to a mounting system 108. Additive manufacturing system 100 also includes a computer control system, or controller 106. Mounting system 108 is moved by an actuator or an actuator system 112 that is configured to move mounting system 108 in an XY plane to cooperate with scanning mirror 142 to facilitate fabricating a layer of component 104 within additive manufacturing system 100. For example, and without limitation, mounting system 108 is pivoted about a central point, moved in a linear path, a curved path, and/or rotated to cover a portion of the powder on powder bed 110 to facilitate directing energy beam 132 along the surface of component 104. Alternatively, housing 136 and energy beam 132 are moved in any orientation and manner that enables additive manufacturing system 100 to function as described herein.

Scanning motor 140 is controlled by controller 106 and is configured to move mirror 142 such that energy beam 132 is reflected to be incident along a predetermined path along powder bed 110, such as, for example, and without limitation, a linear and/or rotational scan path 152. In the exemplary embodiment, the combination of scanning motor 140 and scanning mirror 142 forms a two-dimension scan galvanometer. Alternatively, scanning motor 140 and scanning mirror 142 may include a three-dimension (3D) scan galvanometer, dynamic focusing galvanometer, and/or any other method that may be used to deflect energy beam 132 of laser device 130.

In the exemplary embodiment, powder bed 110 is mounted to a support structure 114, which is moved by actuator system 112. As described above with respect to mounting system 108, actuator system 112 is also configured to move support structure 114 in a Z direction (i.e., normal to a top surface of powder bed 110). In some embodiments, actuator system 112 is also configured to move support structure 114 in the XY plane. For example, and without limitation, in an alternative embodiment where housing 136 is stationary, actuator system 112 moves support structure 114 in the XY plane to cooperate with scanning motor 140 and scanning mirror 142 to direct energy beam 132 of laser device 130 along scan path 152 about powder bed 110. In the exemplary embodiment, actuator system 112 includes, for example, and without limitation, a linear motor(s), a hydraulic and/or pneumatic piston(s), a screw drive mechanism(s), and/or a conveyor system.

In the exemplary embodiment, additive manufacturing system 100 is operated to fabricate component 104 from a computer modeled representation of the 3D geometry of component 104. The computer modeled representation may be produced in a computer aided design (CAD) or similar file. The CAD file of component 104 is converted into a layer-by-layer format that includes a plurality of build parameters for each layer of component 104, for example, build layer 116 of component 104. In the exemplary embodiment, component 104 is modeled in a desired orientation relative to the origin of the coordinate system used in additive manufacturing system 100. The geometry of component 104 is sliced into a stack of layers of a desired thickness, such that the geometry of each layer is an outline of the cross-section through component 104 at that particular layer location. Scan paths 152 are generated across the geometry of a respective layer. The build parameters are applied along scan path 152 to fabricate that layer of component 104 from the material used to construct component 104. The steps are repeated for each respective layer of component 104 geometry. Once the process is completed, an electronic computer build file (or files) is generated, including all of the layers. The build file is loaded into controller 106 of additive manufacturing system 100 to control the system during fabrication of each layer.

After the build file is loaded into controller 106, additive manufacturing system 100 is operated to generate component 104 by implementing the layer-by-layer manufacturing process, such as a direct metal laser melting method. The exemplary layer-by-layer additive manufacturing process does not use a pre-existing article as the precursor to the final component, rather the process produces component 104 from a raw material in a configurable form, such as a powder. For example, and without limitation, a steel component can be additively manufactured using a steel powder. Additive manufacturing system 100 enables fabrication of components, such as component 104, using a broad range of materials, for example, and without limitation, metals, ceramics, glass, and polymers.

Figure 2:
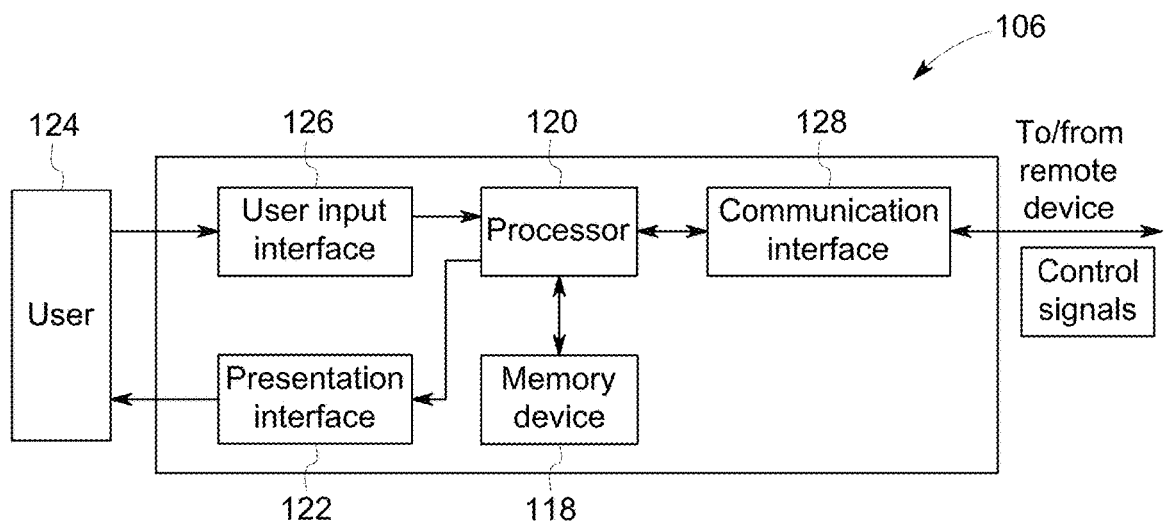
FIG. 2 is a block diagram of a controller that is used to operate the additive manufacturing system shown in FIG. 1.

FIG. 2 is a block diagram of controller 106 that is used to operate additive manufacturing system 100 (shown in FIG. 1). In the exemplary embodiment, controller 106 is any type of controller typically provided by a manufacturer of additive manufacturing system 100 to control operation of additive manufacturing system 100. Controller 106 executes operations to control the operation of additive manufacturing system 100 based at least partially on instructions from human operators. Controller 106 includes, for example, a 3D model of component 104 to be fabricated by additive manufacturing system 100. Operations executed by controller 106 include controlling power output of laser device 130 (shown in FIG. 1) and adjusting mounting system 108 and/or support structure 114, via actuator system 112 (all shown in FIG. 1) to control the scanning velocity of energy beam 132. Controller 106 is also configured to control scanning motor 140 to direct scanning mirror 142 to further control the scanning velocity of energy beam 132 within additive manufacturing system 100. In alternative embodiments, controller 106 may execute any operation that enables additive manufacturing system 100 to function as described herein.

In the exemplary embodiment, controller 106 includes a memory device 118 and a processor 120 coupled to memory device 118. Processor 120 may include one or more processing units, such as, without limitation, a multi-core configuration. Processor 120 is any type of processor that permits controller 106 to operate as described herein. In some embodiments, executable instructions are stored in memory device 118. Controller 106 is configurable to perform one or more operations described herein by programming processor 120. For example, processor 120 may be programmed by encoding an operation as one or more executable instructions and providing the executable instructions in memory device 118. In the exemplary embodiment, memory device 118 is one or more devices that enable storage and retrieval of information such as executable instructions or other data. Memory device 118 may include one or more computer readable media, such as, without limitation, random access memory (RAM), dynamic RAM, static RAM, a solid-state disk, a hard disk, read-only memory (ROM), erasable programmable ROM, electrically erasable programmable ROM, or non-volatile RAM memory. The above memory types are exemplary only, and are thus not limiting as to the types of memory usable for storage of a computer program.

Memory device 118 may be configured to store any type of data, including, without limitation, build parameters associated with component 104. In some embodiments, processor 120 removes or "purges" data from memory device 118 based on the age of the data. For example, processor 120 may overwrite previously recorded and stored data associated with a subsequent time or event. In addition, or alternatively, processor 120 may remove data that exceeds a predetermined time interval. In addition, memory device 118 includes, without limitation, sufficient data, algorithms, and commands to facilitate monitoring of build parameters and the geometric conditions of component 104 being fabricated by additive manufacturing system 100.

In some embodiments, controller 106 includes a presentation interface 122 coupled to processor 120. Presentation interface 122 presents information, such as the operating conditions of additive manufacturing system 100, to a user 124. In one embodiment, presentation interface 122 includes a display adapter (not shown) coupled to a display device (not shown), such as a cathode ray tube (CRT), a liquid crystal display (LCD), an organic LED (OLED) display, or an "electronic ink" display. In some embodiments, presentation interface 122 includes one or more display devices. In addition, or alternatively, presentation interface 122 includes an audio output device (not shown), for example, without limitation, an audio adapter or a speaker (not shown).

In some embodiments, controller 106 includes a user input interface 126. In the exemplary embodiment, user input interface 126 is coupled to processor 120 and receives input from user 124. User input interface 126 may include, for example, without limitation, a keyboard, a pointing device, a mouse, a stylus, a touch sensitive panel, such as, without limitation, a touch pad or a touch screen, and/or an audio input interface, such as, without limitation, a microphone. A single component, such as a touch screen, may function as both a display device of presentation interface 122 and user input interface 126.

In the exemplary embodiment, a communication interface 128 is coupled to processor 120 and is configured to be coupled in communication with one or more other devices, such as laser device 130, and to perform input and output operations with respect to such devices while performing as an input channel. For example, communication interface 128 may include, without limitation, a wired network adapter, a wireless network adapter, a mobile telecommunications adapter, a serial communication adapter, or a parallel communication adapter. Communication interface 128 may receive a data signal from or transmit a data signal to one or more remote devices. For example, in some embodiments, communication interface 128 of controller 106 may transmit/receive a data signal to/from actuator system 112.

Presentation interface 122 and communication interface 128 are both capable of providing information suitable for use with the methods described herein, such as, providing information to user 124 or processor 120. Accordingly, presentation interface 122 and communication interface 128 may be referred to as output devices. Similarly, user input interface 126 and communication interface 128 are capable of receiving information suitable for use with the methods described herein and may be referred to as input devices.

Figure 3:
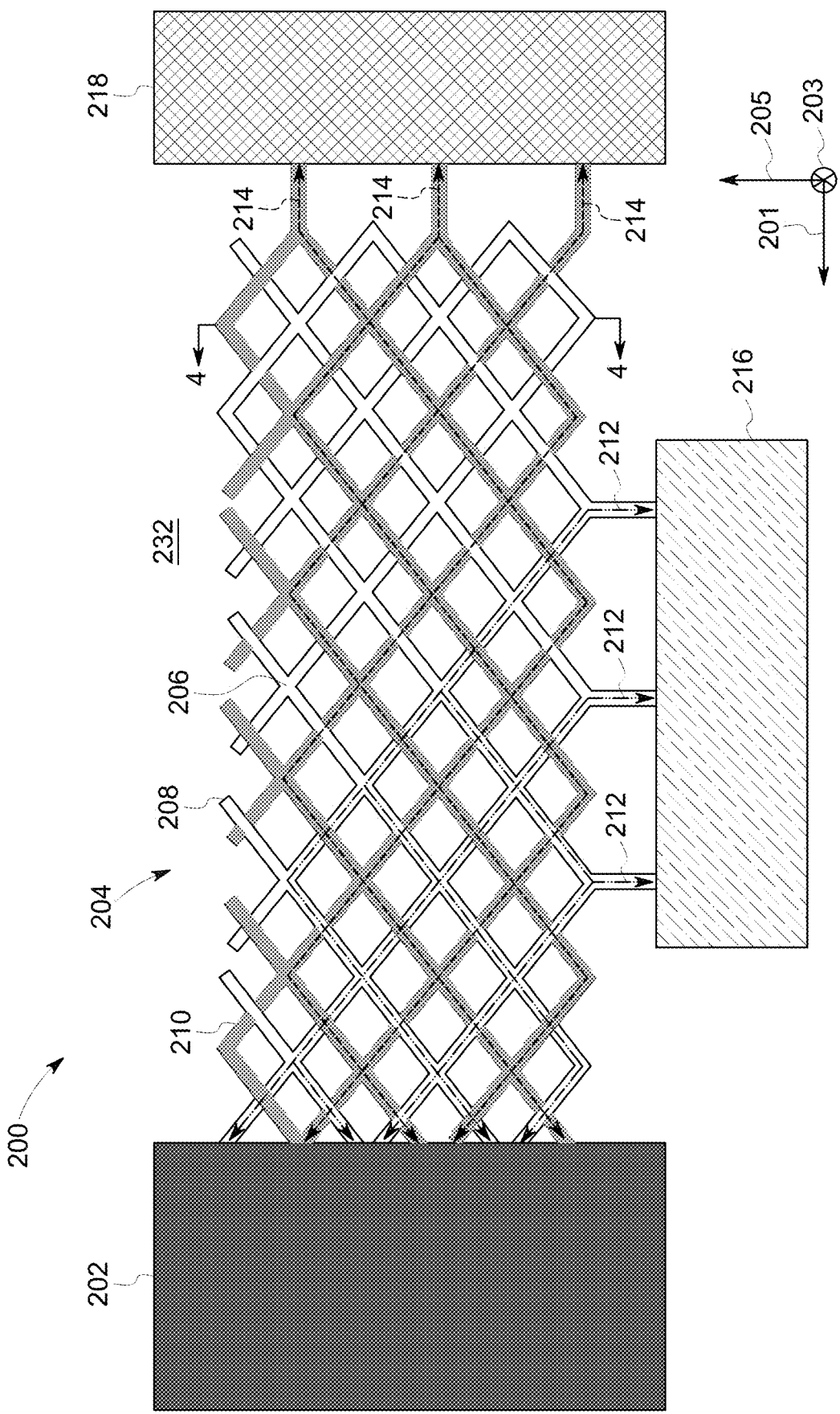
FIG. 3 is a side view of a component with a solid structure portion and an exemplary unit cell structure portion coupled to two loads.
Figure 4:
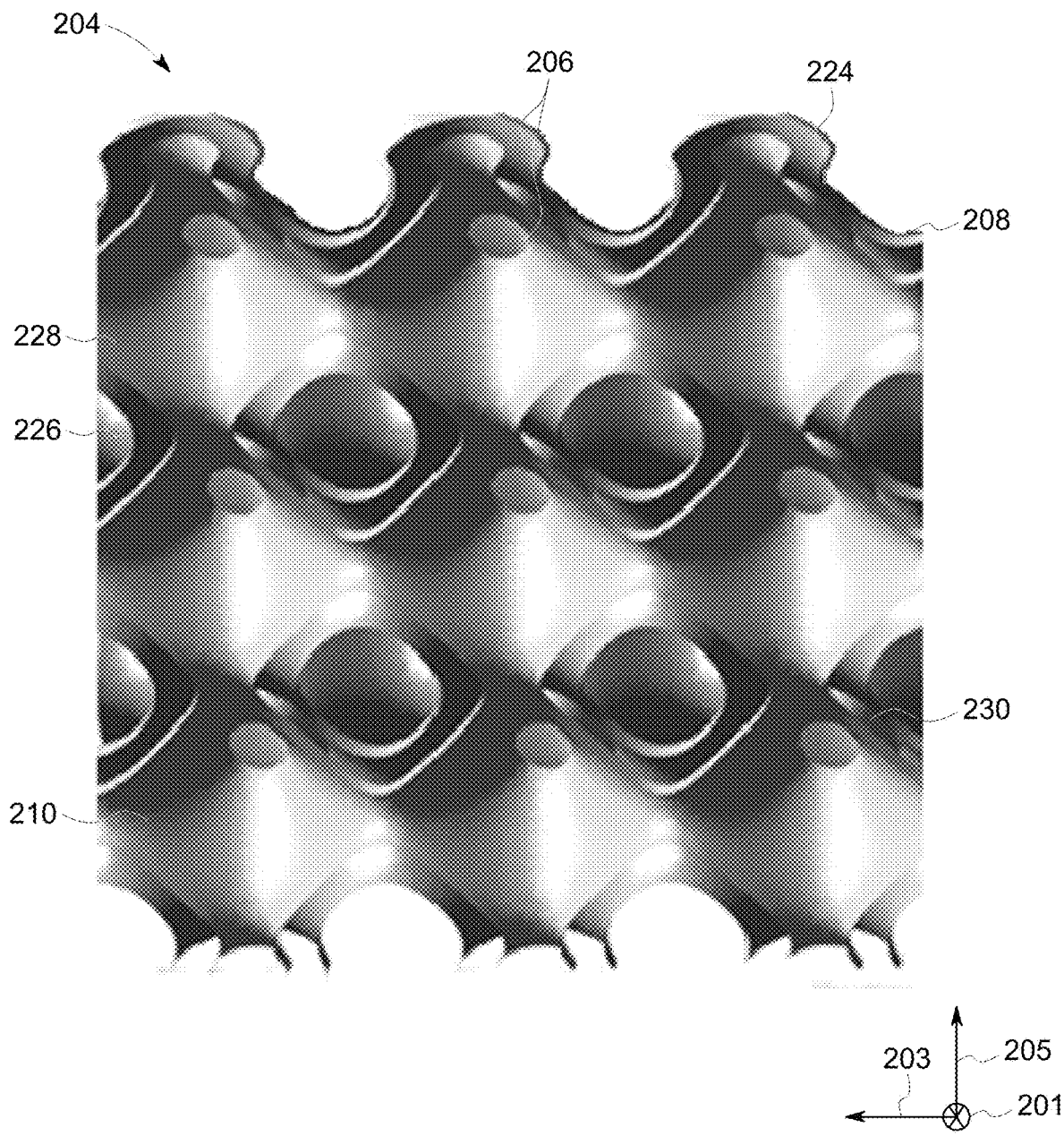
FIG. 4 is a section view of the unit cell structure taken about section line 4-4 of FIG. 3.

FIG. 3 is a side view of a component 200 with a first, solid structure 202 and an exemplary second, unit cell structure 204 coupled to a first load 216 and a second load 218. FIG. 4 is a section view of second structure 204 taken about section line 4-4 (shown in FIG. 3). Component 200 includes second structure 204, which is coupled to first structure 202 and facilitates inclusion of a lightweight multifunctional nested unit cell structure that has decoupled load paths. A longitudinal, or first, axis 201 of component 200 is defined. A transverse, or second, axis 203 extends normal to first axis 201. A vertical, or third, axis 205 extends in a direction that is normal to first axis 201 and normal to second axis 203. Accordingly, first axis 201, second axis 203, and third axis 205 are orthogonal to each other.

In the exemplary embodiment, second structure 204 includes a first section 208 and a second section 210. First section 208 defines a first load path 212 and includes a first plurality of unit cells 206 joined together. Second section 210 defines a second load path 214 that is separate and isolated from first load path 212, and includes a second plurality of unit cells 206 joined together. First load path 212 and second load path 214 are configured to enable loading to travel from first structure 202 to first load 216 and second load 218, respectively, and also to enable loading to travel from first load 216 and second load 218, respectively, to first structure 202. For example, a thermal load present at first load 216 may facilitate the transfer of thermal energy through first load path 212 from first load 216 to first structure 202. A thermal load present at first load 216 may also facilitate the transfer of thermal energy from first structure 202 to first load 216, based on the temperature gradient present between first structure 202 and first load 216. Each unit cell 206 of second section 208 is nested within and spaced apart from each unit cell 206 of the first plurality of unit cells 206 of first section 210. In an alternative embodiment, second structure 204 includes more than two sections of unit cells 206. In a further alternative embodiment, first section 208 includes a first material and second section 210 includes a second, different material. In other alternative embodiments, second structure 204 may be configured in any manner that enables component 200 to function as described herein.

In the exemplary embodiment, first section 208 is coupled to first structure 202 and first load 216, and second section 210 is coupled to first structure 202 and second load 218. In the exemplary embodiment, first load 216 is a mechanical load and second load 218 is a thermal load. In alternative embodiments, first load 216 and second load 218 may be at least one of a mechanical load, a thermal load, and an electrical load. In further alternative embodiments, first section 208 and second section 210 may be coupled to more than one load. In other alternative embodiments, first section 208 and second section may be coupled to any number of loads, no loads, that enables component 200 to function as described herein.

In the exemplary embodiment, first section 208 and second section 210 include a plurality of spherical unit cells 206 joined together. Each unit cell 206 of first section 208 has a substantially continuous inner wall 224 and a substantially continuous outer wall 226, each inner wall 224 joined to at least one inner wall 224 of an adjacent unit cell 206, and each outer wall 226 joined to at least one outer wall 226 of an adjacent unit cell 206. In an alternative embodiment, first section 208 and second section 210 include the plurality of unit cells 206 arranged as a lattice structure. In a further alternative embodiment, first section 208 and second section 210 include a plurality of lattice structure unit cells 206, wherein each lattice unit cell 206 has a lattice shape of at least one of triclinic, monoclinic, orthorhombic, tetragonal, hexagonal, cubic, and spherical. In other alternative embodiments, first section 208 and second section 210 include a plurality of unit cells 206 having a beam structure. In yet another alternative embodiment, first section 208 and second section 210 include any arrangement of unit cells 206 that enables component 200 to function as described herein.

Figure 5:
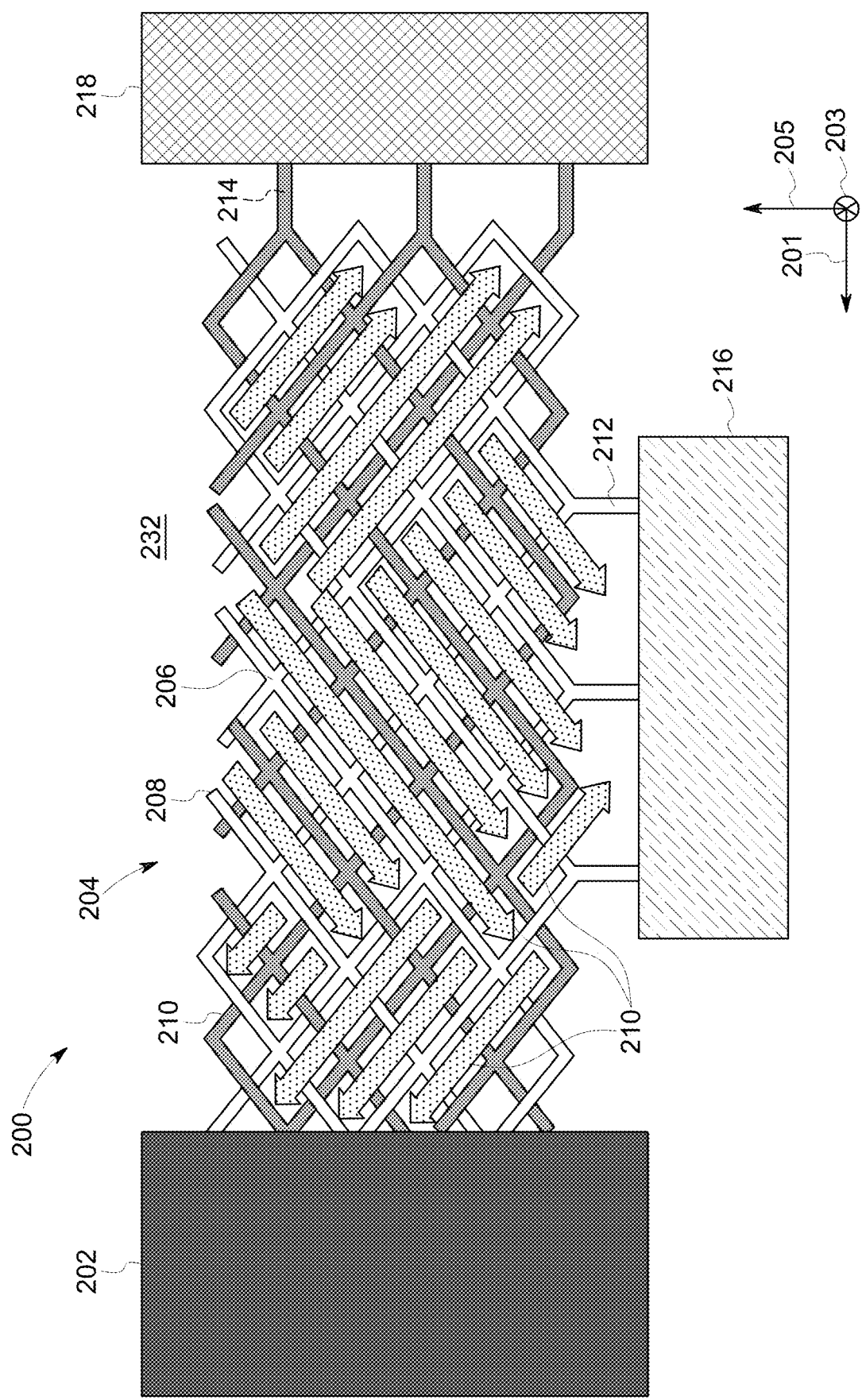
FIG. 5 is a side view of the component and the unit cell structure shown in FIG. 3 illustrating an exemplary first passageway.
Figure 6:
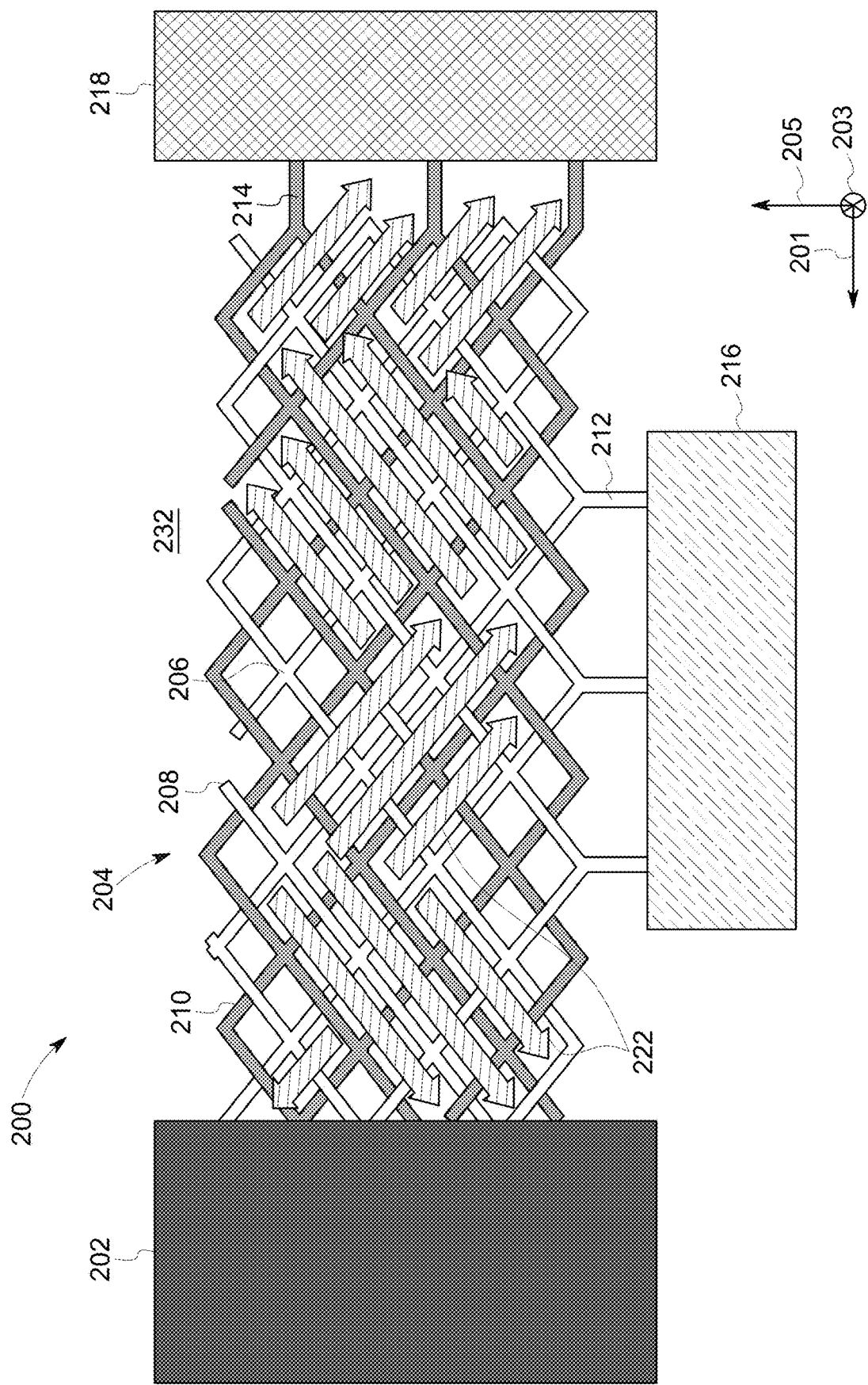
FIG. 6 is a side view of the component and the unit cell structure shown in FIG. 3 illustrating an exemplary second passageway.

FIG. 5 is a side view of component 200 and second structure 204 (shown in FIG. 3) illustrating an exemplary first passageway 220. FIG. 6 is a side view of component 200 and second structure 204 (shown in FIG. 3) illustrating an exemplary second passageway 222. In the exemplary embodiment, with reference to FIGS. 4-6, second structure 204 defines first passageway 220 and second passageway 222. First passageway 220 is defined between first section 208 and second section 210. Second passageway 222 is defined within and between each unit cell of second section 210. More specifically, first passageway 220 extends between a plurality of inner walls 224 of coupled unit cells 206 of first section 208 and a plurality of outer walls 230 of second section 210, and between first structure 202 and first load 208. Second passageway 222 extends between a plurality of inner walls 228 of coupled unit cells 206 of second section 210, and between first structure 202 and second load 218. In the exemplary embodiment first passageway 220 and second passageway 222 are closed off from an exterior environment 232. In an alternative embodiment, at least one of first passageway 220 and second passageway 222 is at least partially open to outside environment 232. In yet another embodiment, at least one of first passageway 220 and second passageway 222 is filled with a fluid and/or gas that facilitates thermal conduction between first section 208, second section 210, and outside environment 232. In other alternative embodiments, first passageway 220 and second passageway 222 are configured in any manner that enables component 200 to function as described herein.

In the exemplary embodiment, first section 208 and second section 210 facilitate carrying non-uniform loading by component 200 over separate load paths without mechanical interaction between first section 208 and second section 210. More specifically, first load 216 may be carried by first section 208 through first load path 212 and second load 218 may be carried by second section 210 through second load path 214 without mechanical interaction occurring between first section 208 and second section 210. Additionally, because of the nested spaced-apart unit cell configuration of structure 204, i) thermal loads carried by first section 208 through first load path 212 and ii) thermal loads carried by second section 210 through second load path 214 are not in conductive communication with an adjacent one of first section 208 and second section 210. For example, structure 202 may be used to isolate mechanical loads and deflections caused by thermal loads by coupling first, mechanical load 216 to first section 208, and by coupling second, thermal load 218 to second section 210. In another example, first load 216 is an electrical load and second load 218 is a heat sink configured to receive thermal energy from component 200 through second section 210. Additionally, a thermally insulating substance may be introduced to at least one of first passageway 220 and second passageway 222 to facilitate inhibiting the transfer of thermal energy between first load path 212 and second load path 214.

Figure 7:
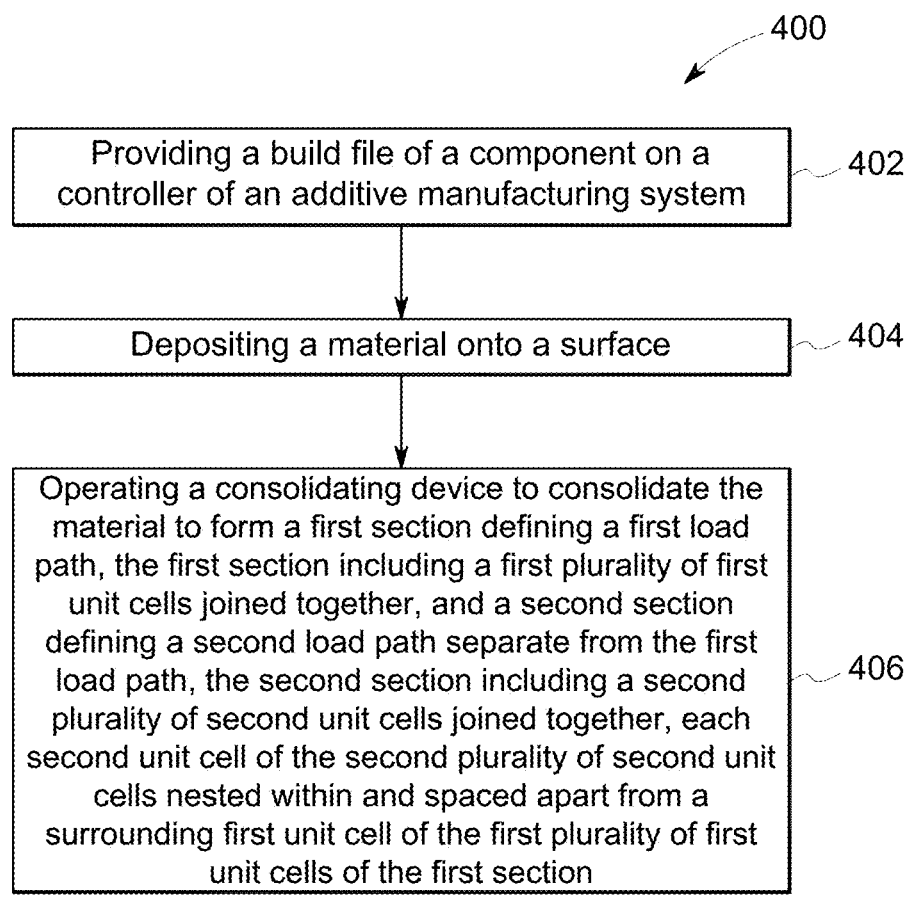
FIG. 7 is a flow chart illustrating a method for fabricating a component in a powder bed.

FIG. 7 is a flow chart illustrating a method 400 for fabricating component 104 with an additive manufacturing system 100 including a consolidating device 138. Referring to FIGS. 1, 2, and 7, method 400 includes providing 402 a build file of a component 104 on a controller 106 of an additive manufacturing system 100. Method 400 also includes depositing 404 a material onto a surface of component 104. Finally, method 400 further includes operating 406 the consolidating device 138 to consolidate the material to form a first section 208 defining a first load path 212, first section 208 including a first plurality of first unit cells 206 joined together, and a second section 210 defining a second load path 214 separate from the first load path 212, second section 210 including a second plurality of second unit cells 206 joined together, each second unit cell 206 of the second plurality of second unit cells 206 nested within and spaced apart from a surrounding first unit cell 206 of the first plurality of first unit cells 206 of first section 208.

The above-described unit cell structures provide an efficient method for decoupling load paths within a component. Specifically, the unit cell structure includes a first section of unit cells joined together and defining a first load path, and a second section of unit cells joined together and nested within the first section of unit cells, and defining a second load path. The decoupled load bearing sections are able to independently carry the load without affecting an adjacent decoupled load bearing section, each load bearing section within the same bounding volume of the structure. Additionally, the volume within and between the unit cell sections may be utilized as cooling or heating circuits, each circuit isolated from an adjacent circuit. Decoupling the load paths within a given unit cell structure of a component facilitates manufacturing multifunctional unit cell structures that are lightweight with optimize load bearing characteristics for each load the structure is exposed to.

An exemplary technical effect of the methods, systems, and apparatus described herein includes at least one of: (a) replacing at least a portion of the solid structure of a component with a multifunctional nested unit cell structure; (b) decoupling the load paths for the loads present on the component; and (c) creating a component with optimized load bearing properties and characteristics.

Exemplary embodiments of multifunctional nested unit cell structures having decoupled load bearing characteristics are described above in detail. The multifunctional nested unit cell structures, and methods of fabricating components including such structures are not limited to the specific embodiments described herein, but rather, components of systems and/or steps of the methods may be utilized independently and separately from other components and/or steps described herein. For example, the methods may also be used in combination with other components which require a unit cell internal structure having decoupled load paths, and are not limited to practice with only the systems and methods as described herein. Rather, the exemplary embodiment may be implemented and utilized in connection with many other manufacturing or construction applications that require a multifunctional decoupled load paths unit cell structure.

Although specific features of various embodiments of the disclosure may be shown in some drawings and not in others, this is for convenience only. In accordance with the principles of the disclosure, any feature of a drawing may be referenced and/or claimed in combination with any feature of any other drawing.

This written description uses examples to describe the disclosure, including the best mode, and also to enable any person skilled in the art to practice the disclosure, including making and using any devices or systems and performing any incorporated methods. The patentable scope of the disclosure is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. A unit cell structure comprising:
   a first section defining a first load path, said first section comprising a first plurality of first unit cells joined together; and
   a second section defining a second load path separate from said first load path, said second section comprising a second plurality of second unit cells joined together, each second unit cell of said second plurality of second unit cells nested within and spaced apart from each first unit cell of said first plurality of first unit cells, wherein the second load path transfers a different load than the first load path.
2. The unit cell structure in accordance with claim 1, wherein said unit cell structure comprises more than two sections.
3. The unit cell structure in accordance with claim 1, wherein said first section comprises a first material, and wherein said second section comprises a second material, the second material different from the first material.

4. The unit cell structure in accordance with claim 1, wherein said unit cell structure defines a first passageway and a second passageway, said first passageway is defined between said first section and said second section and said second passageway is defined within and between second unit cells of said second section.

5. The unit cell structure in accordance with claim 1, wherein said first section and said second section have a lattice structure.

6. The unit cell structure in accordance with claim 5, wherein said lattice structure comprises unit cells having at least one of a triclinic, a monoclinic, an orthorhombic, a tetragonal, a hexagonal, a cubic, and a spherical shape.

7. A component comprising:
a first structure;
a second structure comprising:
 a first section defining a first load path, said first section comprising a first plurality of first unit cells joined together, wherein said first section is coupled to said first structure and a first load; and
 a second section defining a second load path separate from the first load path, said second section comprising a second plurality of second unit cells joined together, each second unit cell of said second plurality of second unit cells nested within and spaced apart from each first unit cell of said first plurality of first unit cells of said first section, wherein said second section is coupled to said first structure and a second load, wherein the second load path transfers a different load than the first load path.

8. The component in accordance with claim 7, wherein said second structure comprises more than two sections.

9. The component in accordance with claim 7, wherein said first section comprises a first material, and wherein said second section comprises a second material, the second material different from the first material.

10. The component in accordance with claim 7, wherein said second structure defines a first passageway and a second passageway, said first passageway is defined between said first section and said second section and said second passageway is defined within and between second unit cells of said second section.

11. The component in accordance with claim 7, wherein the first load and the second load are each at least one of a mechanical load, a thermal load, and an electrical load.

12. The component in accordance with claim 11, wherein said first section and said second section are coupled to more than one load.

13. The component in accordance with claim 7, wherein said first section and said second section have a lattice structure.

14. The component in accordance with claim 13, wherein said lattice structure comprises unit cells having at least one of a triclinic, a monoclinic, an orthorhombic, a tetragonal, a hexagonal, a cubic, and a spherical shape.

* * * * *